US007927962B2

(12) United States Patent
Yoo

(10) Patent No.: US 7,927,962 B2
(45) Date of Patent: Apr. 19, 2011

(54) SEMICONDUCTOR DEVICE HAVING BURIED INSULATION FILMS AND METHOD OF MANUFACTURING THE SAME

(75) Inventor: Min Soo Yoo, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 225 days.

(21) Appl. No.: 12/399,683

(22) Filed: Mar. 6, 2009

(65) Prior Publication Data

US 2010/0096701 A1   Apr. 22, 2010

(30) Foreign Application Priority Data

Oct. 20, 2008 (KR) ................. 10-2008-0102547

(51) Int. Cl.
*H01L 21/76* (2006.01)
(52) U.S. Cl. ........ 438/413; 438/149; 438/405; 438/412; 438/311; 438/481; 257/347; 257/349; 257/506
(58) Field of Classification Search ........... 257/E21.561, 257/E21.562, E21.563, E21.545, E29.233, 257/347, 368, 506, 349, 216, 219; 438/149, 438/295, 311, 404, 479, 481, 967, 146, 405, 438/407, 412, 413
See application file for complete search history.

(56) References Cited

U.S. PATENT DOCUMENTS

| 7,321,144 B2 * | 1/2008 | Oh et al. ............. 257/296 |
| 2008/0145989 A1 * | 6/2008 | Oh et al. ............. 438/296 |
| 2009/0039461 A1 * | 2/2009 | Henson et al. ........ 257/522 |

* cited by examiner

*Primary Examiner* — Thao X Le
*Assistant Examiner* — Thanh Y Tran
(74) *Attorney, Agent, or Firm* — Marshall, Gerstein & Borun LLP

(57) ABSTRACT

A method of manufacturing a semiconductor device and a semiconductor device manufactured by the method, the method comprising: (a) forming a buffer layer on a semiconductor substrate; (b) patterning the buffer layer in a first direction to form buffer layer patterns having lateral surfaces and being spaced from each other at predetermined intervals; (c) forming a semiconductor epitaxial layer on and between the buffer layer patterns; (d) forming a first trench in the semiconductor epitaxial layer in a second direction perpendicular to the first direction to expose lateral surfaces of the buffer layer patterns; (e) selectively removing the buffer layer patterns exposed by the first trench to form spaces; (f) forming buried insulation films in the spaces formed by removal of the buffer layer patterns, a portion of semiconductor epitaxial layer being disposed between the buried insulation films; (g) removing a portion of the semiconductor epitaxial layer disposed between the buried insulation films to form a second trench in the first direction; and (h) forming device isolation films in the first and second trenches.

20 Claims, 12 Drawing Sheets

SEMICONDUCTOR DEVICE HAVING BURIED INSULATION FILMS AND METHOD OF MANUFACTURING THE SAME

BACKGROUND OF THE INVENTION

1. Field of the Invention

The invention relates generally to a semiconductor device and a method of manufacturing the same and, more particularly, to a method of forming a buried insulation film in a bulk silicon wafer and a semiconductor device manufactured using the method.

2. Description of the Related Art

As processes of manufacturing semiconductor devices are finely controlled, there are many technical difficulties in manufacturing Dynamic Random Access Memory (DRAM) having a unit memory cell composed of one transistor and one capacitor. Among the technical difficulties, it is most difficult to improve short channel effect characteristics while simultaneously maintaining sufficient data retention time, and to minimize dielectric loss characteristics in a narrow area while simultaneously fabricating a capacitor having sufficient capacitance. In particular, the technology of fabricating a capacitor which has sufficient capacitance necessary for the operation of DRAM and which can ensure reliability is subject to a technical limitation, and is a very difficult process technology. In order to solve such a problem, wide-ranging research into 1 T DRAM using a floating body effect of a transistor has been made. (1 T DRAM is a "capacitorless" bit cell design that stores data in the parasitic body capacitor that is an inherent part of silicon-on-insulator (SOI) transistors.)

Meanwhile, conventional 1 T-1 C DRAM ("one transistor, one capacitor" DRAM) stores electric charges in a capacitor, whereas 1 T DRAM is used as memory because threshold voltage changes when electric charges are stored in the body of a transistor. Generally, a transistor constituting a memory cell of 1 T DRAM is fabricated using a silicon-on-insulator (SOI) wafer. However, since SOI wafers are expensive, economical efficiency is low. Further, an external circuit for operating a memory cell of 1 T DRAM must also be provided on the SOI wafer.

In order to overcome the low economical efficiency of the SOI wafer, a method of manufacturing 1 T DRAM using a bulk silicon wafer is proposed. In this method, in order to realize a floating body cell, a P-type well is formed in a deep N-type well to cause a floating body to be floated. However, in such a method, since a bulk silicon wafer is used instead of the expensive SOI wafer, economical efficiency can be relatively improved, but sufficient data retention time cannot be ensured due to leakage current generated from the interface between the N-type well and the P-type well.

SUMMARY OF THE INVENTION

Accordingly, the invention provides a method of manufacturing a semiconductor device suitable for use with a bulk silicon wafer instead of an expensive SOI wafer.

The invention also provides a method of forming a buried insulation film in a silicon substrate, preferably a bulk silicon wafer to form a floating body cell in a semiconductor device, preferably a 1 T DRAM having a unit memory cell composed of one transistor.

A method of manufacturing a semiconductor device according to the invention includes: (a) forming a buffer layer on a semiconductor substrate; (b) patterning the buffer layer in a first direction to form buffer layer patterns having lateral surfaces and being spaced apart from each other at predetermined intervals; (c) forming a semiconductor epitaxial layer on and between the buffer layer patterns; (d) forming a first trench in the semiconductor epitaxial layer in a second direction intersecting the first direction to expose lateral surfaces of the buffer layer patterns; (e) selectively removing the buffer layer patterns exposed by the first trench to form spaces; (f) forming buried insulation films in the spaces formed by removal of the buffer layer patterns, a portion of the semiconductor epitaxial layer being disposed between the buried insulation films; (g) removing a portion of the semiconductor epitaxial layer disposed between the buried insulation films to form a second trench in the first direction; and (h) forming device isolation films in the first and second trenches.

A semiconductor device according to the invention is manufactured by the method. In the semiconductor device, a semiconductor epitaxial layer formed on the semiconductor substrate is preferably horizontally isolated by device isolation films, and is preferably vertically isolated from the semiconductor substrate by a buried insulation film. Here, the depth of the device isolation film is preferably deeper than that of the buried insulation film.

The semiconductor device preferably further includes: a gate formed on the semiconductor epitaxial layer isolated by the device isolation film and the buried insulation film; a source region formed in the semiconductor epitaxial layer; and a drain region formed in the semiconductor epitaxial layer and spaced from the source region. In this semiconductor device, the source region and the drain region are preferably formed on the buried insulation film, and thus a portion of the semiconductor epitaxial layer between the source region and the drain region may function as a floating channel body.

BRIEF DESCRIPTION OF THE DRAWINGS

The foregoing and other objects, features, and advantages of the invention will be more clearly understood from the following detailed description taken in conjunction with the accompanying drawings, in which:

FIGS. 1 to 7 are views showing a process of manufacturing a semiconductor device according to the invention, in which FIGS. 8A-8C are views showing an example of a floating body cell formed using a method of manufacturing a semiconductor device according to the invention, in which FIG. 8A is a plan view showing a semiconductor substrate; FIG. 8B is a sectional view showing the semiconductor substrate taken along the line I-I in FIG. 8A; and FIG. 8C is a sectional view showing the semiconductor substrate taken along the line II-II in FIG. 8A.

DESCRIPTION OF THE PREFERRED EMBODIMENTS

Hereinafter, preferred embodiments of the invention are described in detail with reference to the attached drawings.

Figure 1A:
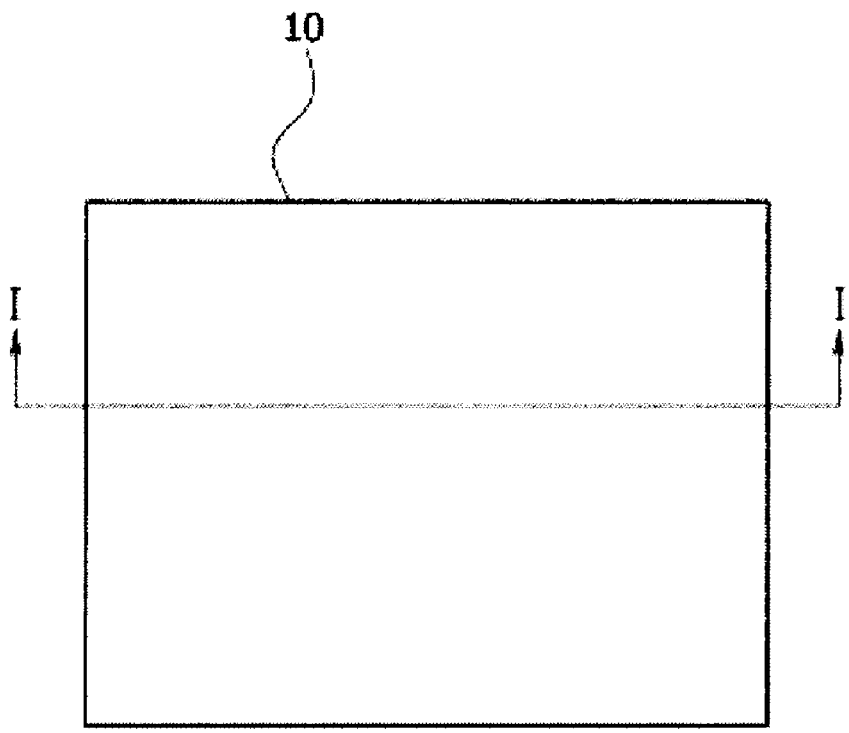
FIGS. 1A, 2A, 3A, 4A, 5A, 6A, and 7A are plan views showing semiconductor substrates.
Figure 1B:
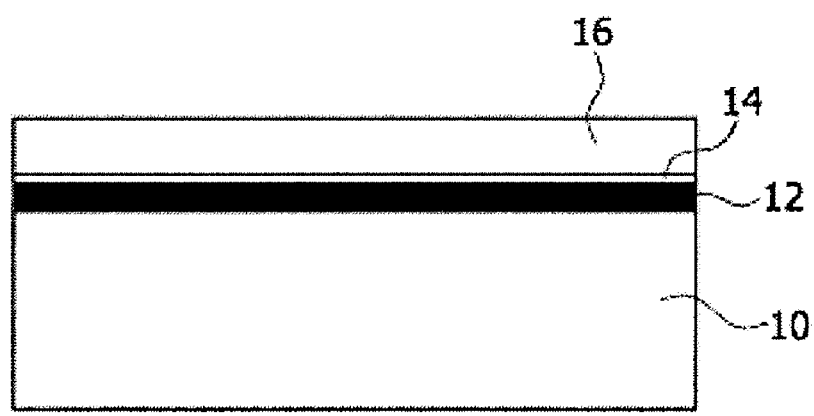
FIGS. 1B, 2B, 3B, 4B, 5B, 6B, and 7B are sectional views showing the semiconductor substrates taken along the lines I-I in FIGS. 1A, 2A, 3A, 4A, 5A, 6A, and 7A, respectively.

First, referring to FIGS. 1A and 1B, a buffer layer is formed on a semiconductor substrate 10, which is preferably a bulk silicon substrate. The buffer layer preferably includes a selective etching layer 12, which can be selectively etched with respect to the semiconductor substrate 10, and a seed layer 14, which can be used as a seed for a semiconductor epitaxial layer in subsequent processes. If desired, the selective etching layer 12 may be the only layer used as the buffer layer, but, in order to prevent defects from occurring in the semiconductor epitaxial layer, which is to be formed in subsequent processes, due to the difference in lattice constant between the selective etching layer and the semiconductor epitaxial layer, it is preferred that the seed layer 14 be formed on the selective etching layer 12. Moreover, when a silicon substrate is used as the semiconductor substrate 10, the selective etching layer 12 is preferably formed of SiGe, but the invention is not limited thereto as long as the selective etching layer 12 can be selectively etched with respect to the semiconductor substrate 10. Furthermore, the selective etching layer 12 and seed layer 14 are preferably formed using an epitaxial growth method, and a mask layer 16, which is to be used in a subsequent patterning process, is formed on the seed layer 14.

Figure 2A:
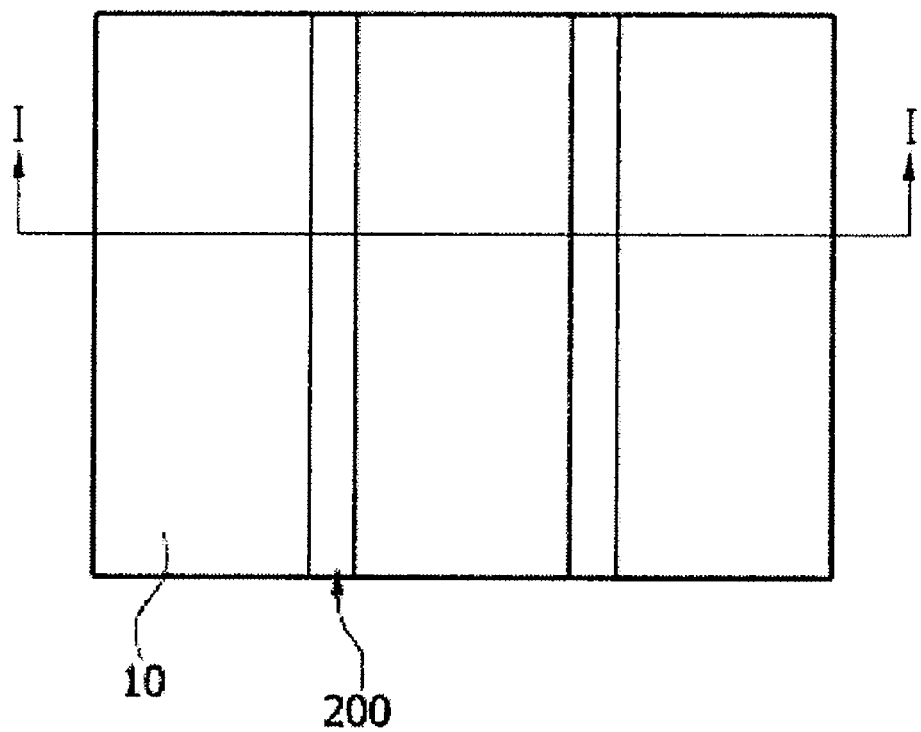
Figure 2B:
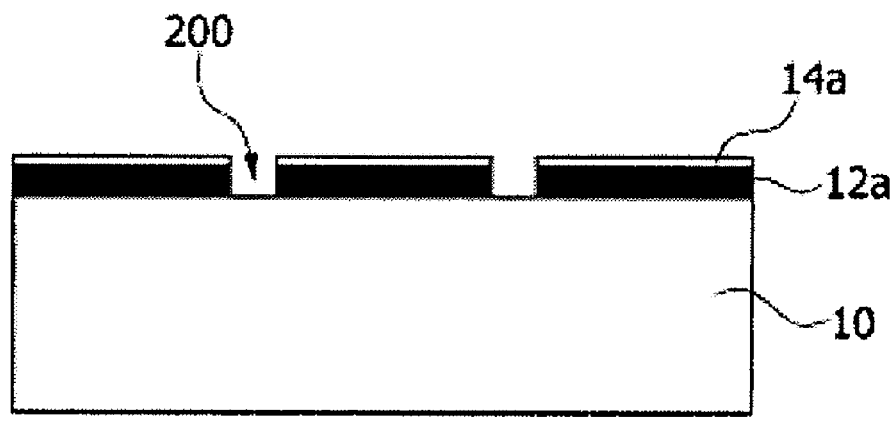
Figure 3A:
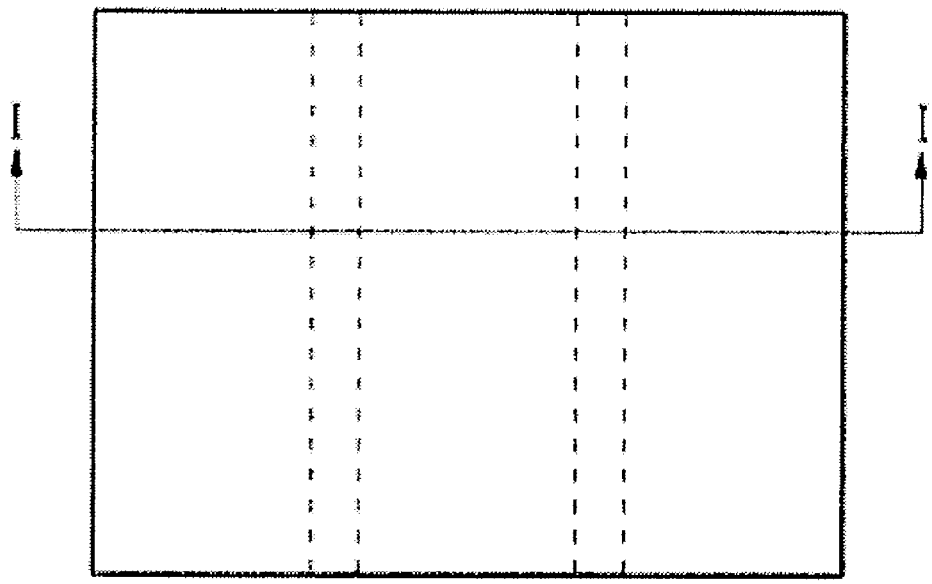
Figure 3B:
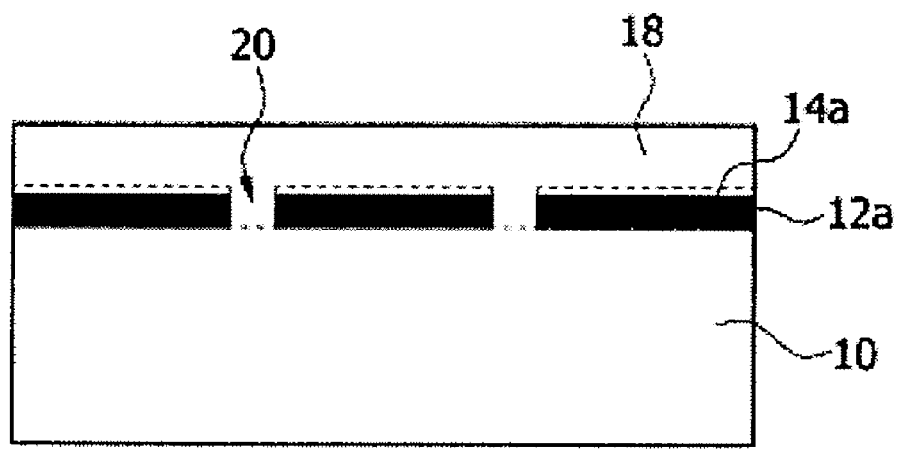
Figure 4A:
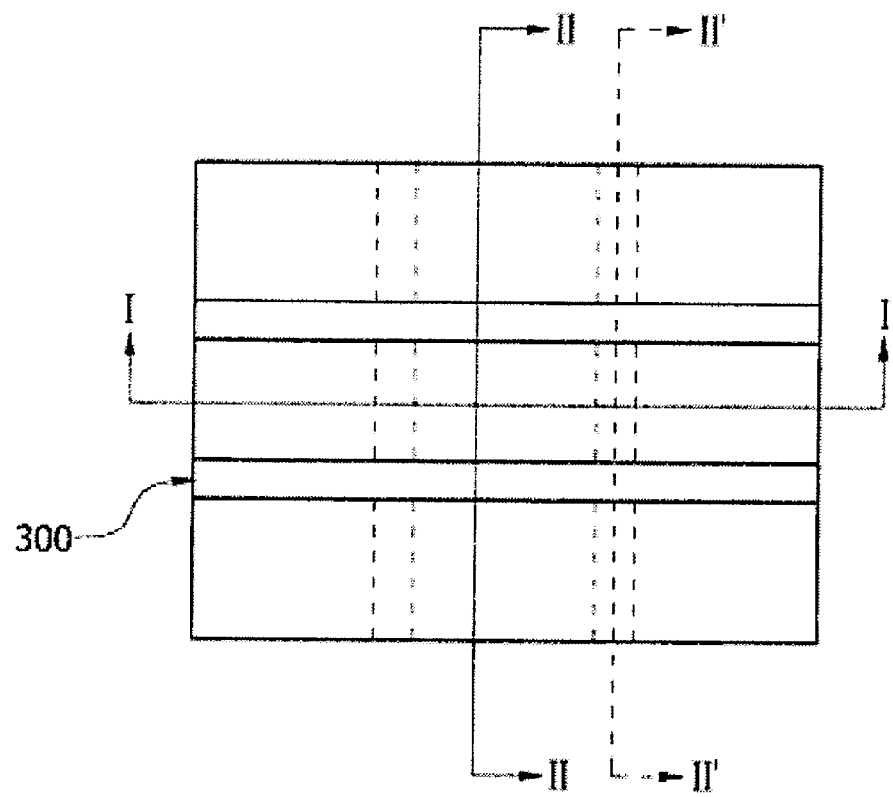
Figure 4B:
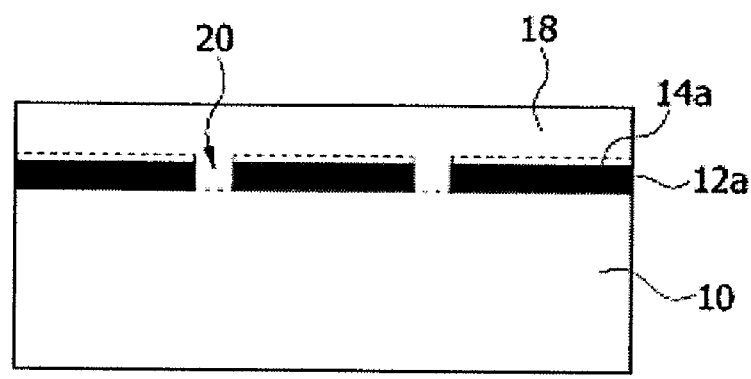
Figure 4C:
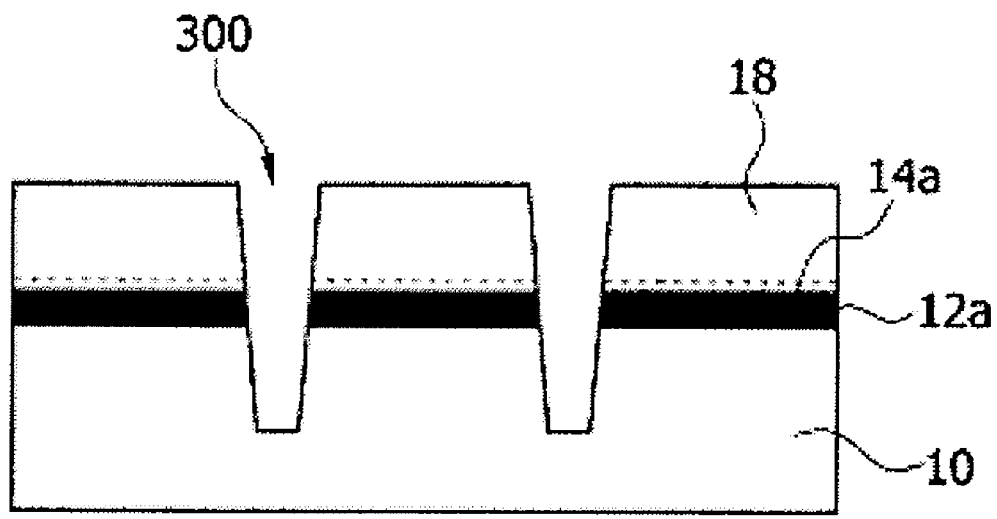
FIGS. 4C, 5C, 6C, and 7C are sectional views showing the semiconductor substrates taken along the lines II-II in FIGS. 4A, 5A, 6A, and 7A, respectivley.
Figure 4D:
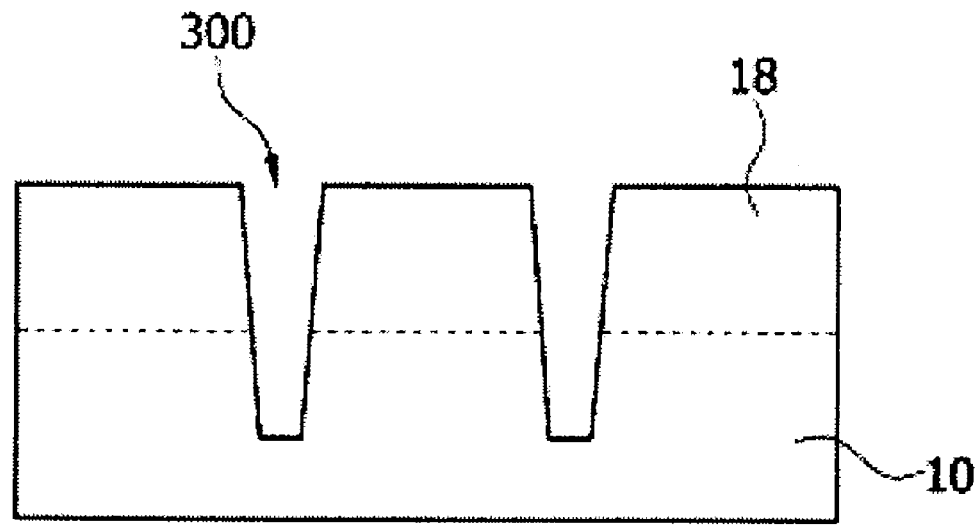
FIGS. 4D, 5D, and 6D are sectional views showing the semiconductor substrates taken along the lines II'-II' in FIGS. 4A, 5A, and 6A, respectively.

Subsequently, referring to FIGS. 2A and 2B, the buffer layer is patterned using the mask layer 16 through a photo-etching process. Thus, the buffer layer is formed into buffer layer patterns including selective etching layer patterns 12a and seed layer patterns 14a, which are formed by patterning the buffer layer in a first direction. The buffer layer patterns are spaced from each other at predetermined intervals 200. Then, as shown in FIGS. 3A and 3B, a silicon epitaxial layer, i.e., the semiconductor epitaxial layer 18, is formed on the structure described above. Specifically, the silicon epitaxial layer is formed on the areas of the semiconductor substrate 10 exposed between the buffer layer patterns and on the buffer layer patterns (i.e., the seed layer patterns 14a). Here, portions 20, which are formed on the semiconductor substrate 10 and which are interposed between the buffer layer patterns, support the silicon epitaxial layer 18 after a subsequent process of selectively etching the buffer layer pattern (i.e., a process of removing the selective etching layer 12a).

Subsequently, referring to FIGS. 4A to 4D, first trenches 300 are formed in a direction intersecting the buffer layer patterns, i.e., in a second direction intersecting the first direction. For example, the first trenches 300 are formed by partially removing the semiconductor epitaxial layer 18, seed layer patterns 14a, and selective etching layer patterns 12a through a photographic process and an etching process. In this case, in order to ensure a process margin, it is preferred that the first trenches 300 be formed to a depth at which a part of the semiconductor substrate 10 is removed, but the first trenches 300 may be formed such that the lateral surfaces of the selective etching layer patterns 12a are exposed by the first trenches 300. The selective etching layer patterns 12a exposed by the first trenches 300 are selectively removed through a subsequent etching process. Meanwhile, the second direction is preferably perpendicular to the first direction, therefore, the first trenches 300 are preferably formed in a direction in which they intersect the buffer layer patterns at predetermined angles, preferably at right angles.

Next, referring to FIGS. 5A to 5D, the selective etching layer patterns 12a exposed by the first trenches 300 are removed. In this case, the selective etching layer patterns 12a are preferably removed through a selective etching process. In particular, in the case where the selective etching layer comprises SiGe, the selective etching layer patterns 12a are preferably selectively removed through a wet etching process. For example, the selective etching layer patterns 12a may be selectively removed using a mixed solution in which a polysilicon etchant containing $HNO_3$ (70%), HF (49%), $CH_3COOH$ (99.9%) and $H_2O$ is mixed with deionized water. When the selective etching layer patterns 12a are removed through a wet etching process, spaces 12b are formed between the semiconductor epitaxial layer 18 and the semiconductor substrate 10. In this case, the semiconductor epitaxial layer 18 is supported by the portions 20 formed on the semiconductor substrate 10 and interposed between the buffer layer patterns in the previous process.

Subsequently, referring to FIGS. 6A to 6D, a buried insulation film 22 is formed in the spaces 12b formed by removing the selective etching layer patterns 12a. The buried insulation film 22 is preferably formed through a thermal oxidation method, a chemical vapor deposition method, or the like. In this case, the buried insulation film 22 is formed in a state in which the first trenches 300 are exposed, and thus an insulation layer 22a can be formed on inner walls of the first trenches 300. The buried insulation film 22 is preferably a three-layered structure including a thermally-oxidized film formed by thermally oxidizing the surfaces of the semiconductor substrate 10 and semiconductor epitaxial layer 18, a liner nitride film formed through chemical vapor deposition, and an oxide film formed through chemical vapor deposition, for example.

Figure 5A:
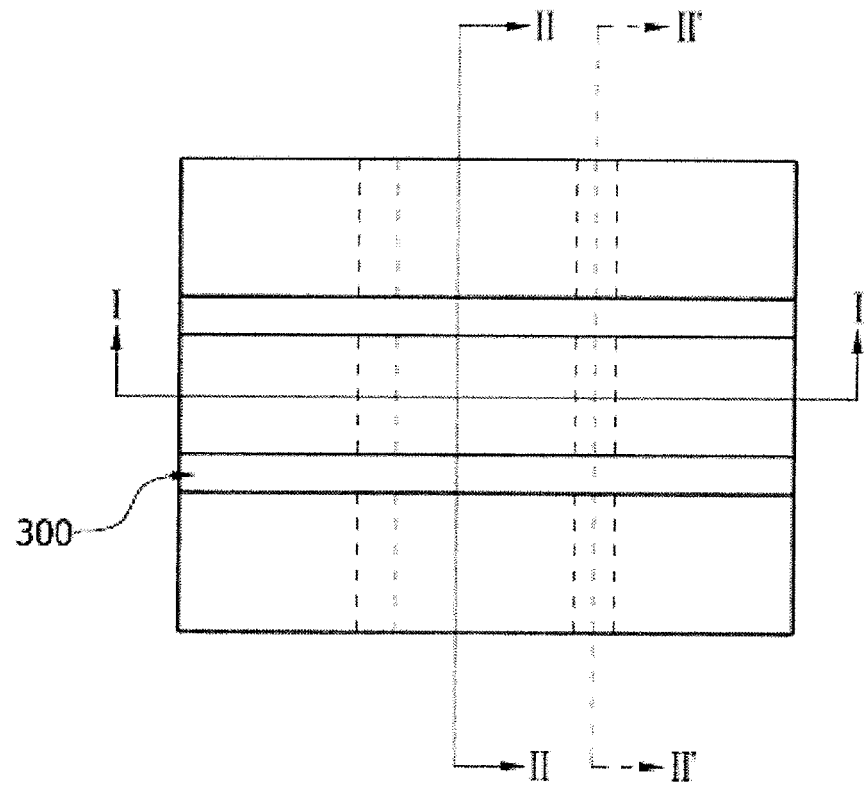
Figure 5B:
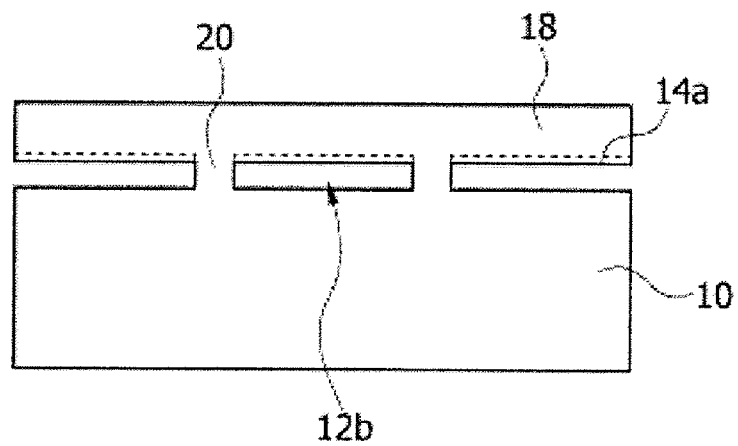
Figure 5C:
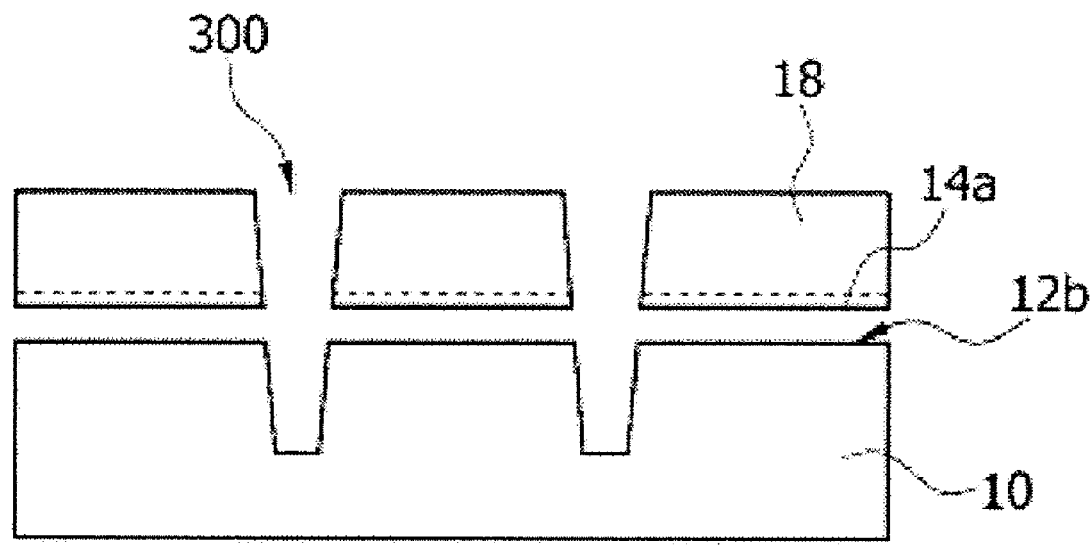
Figure 5D:
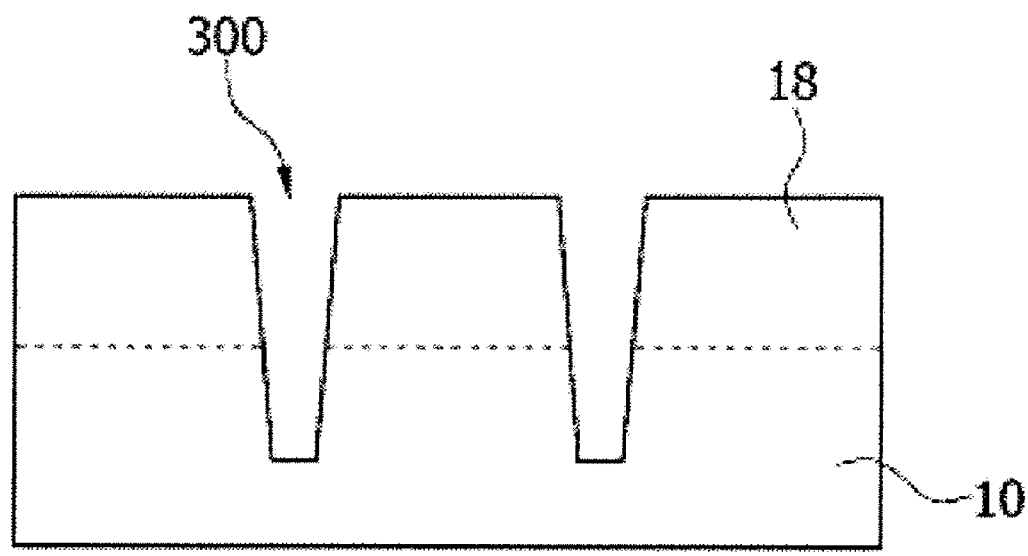
Figure 6A:
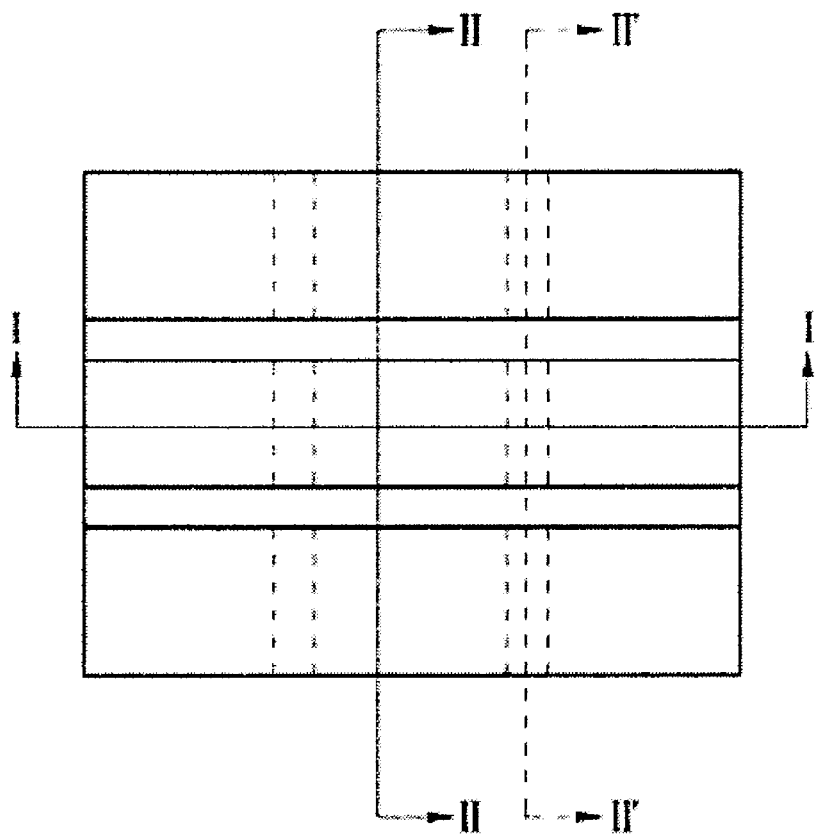
Figure 6B:
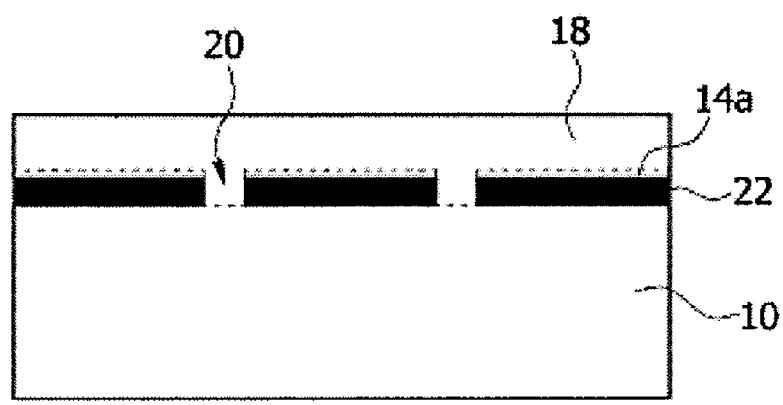
Figure 6C:
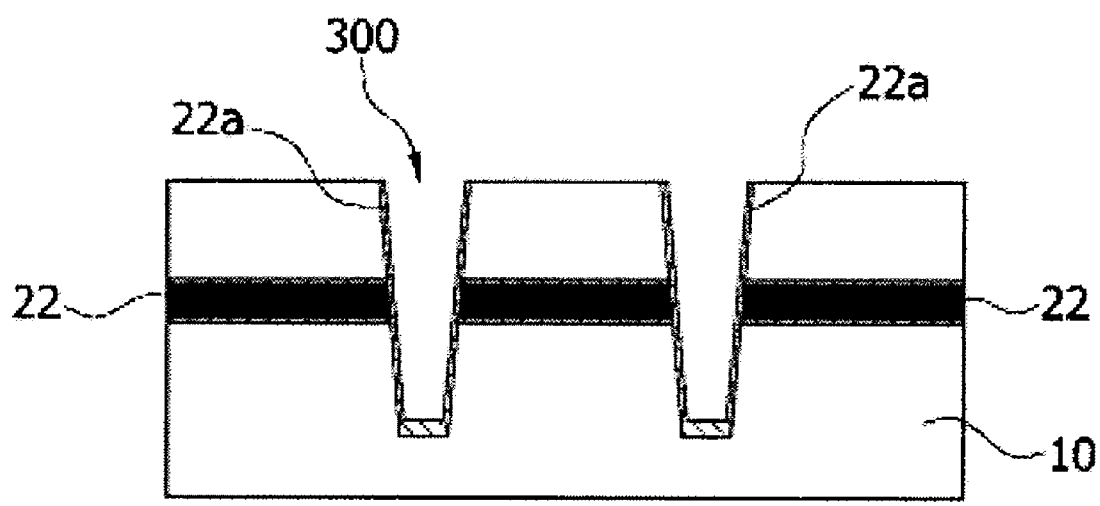
Figure 6D:
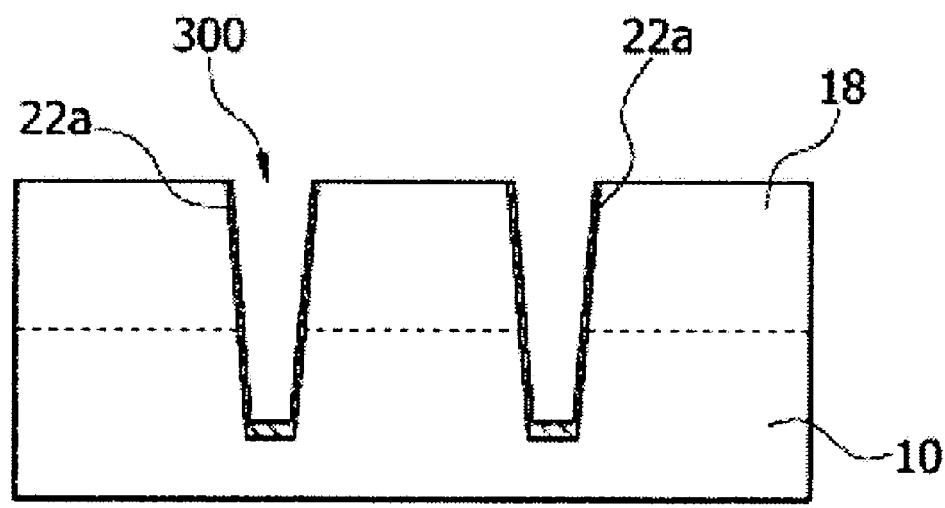
Figure 7A:
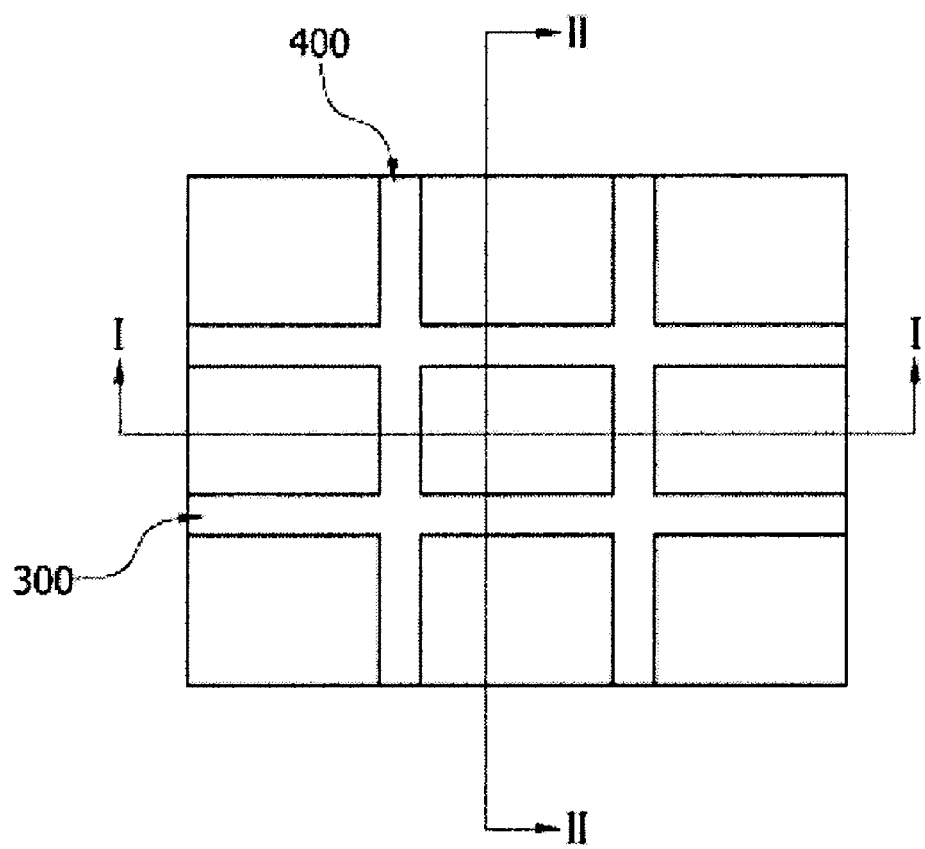
Figure 7B:
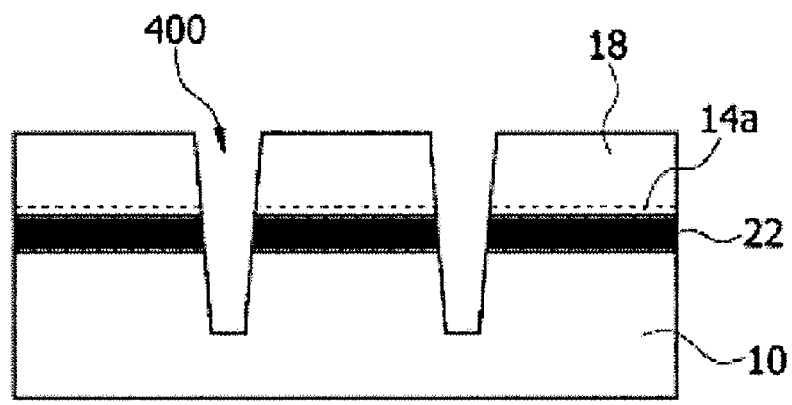
Figure 7C:
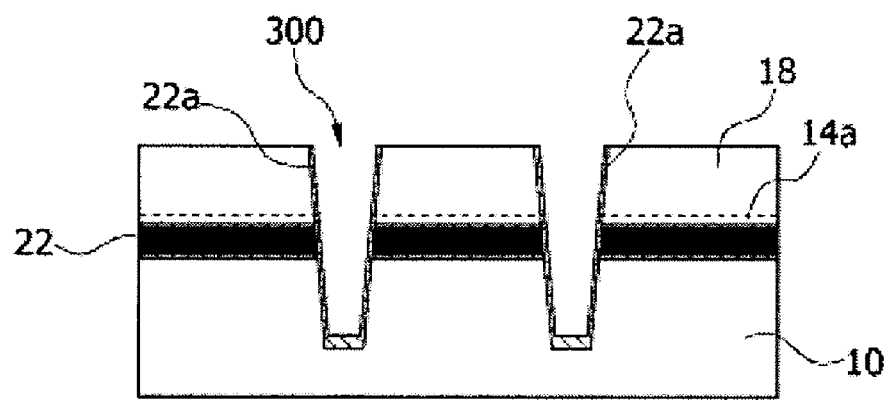

Next, as shown in FIGS. 7A to 7C, second trenches 400 are formed in a direction perpendicular to the first trenches 300, namely, in the first direction. In this case, the second trenches 400 are formed by removing the semiconductor epitaxial layer 18, preferably the portions 20 supporting the semiconductor epitaxial layer 18, as shown in FIG. 5B. For example, the second trenches 400 are preferably formed through a photographic process and an etching process. In the formation of the second trenches 400, a mask the same as the mask which was used in the patterning process of the buffer layer, shown in FIGS. 2A and 2B, is preferably used. In particular, the second trenches 400 are formed to a depth equal to or greater than that of the buried insulation film 22, and, in order to ensure a process margin, the second trenches 400 may be formed by removing a part of the semiconductor substrate 10. Thereafter, device isolation films are formed by burying insulation films in the first trenches 300 and second trenches 400.

In the semiconductor device formed through the above mentioned processes, the semiconductor epitaxial layer 18 is horizontally isolated by the device isolation films formed in the first trenches 300 and second trenches 400, and is vertically isolated from the semiconductor substrate 10 by the buried insulation film 22. FIG. 8 shows an example of a floating body cell formed using the method of manufacturing a semiconductor device according to the invention.

Figure 8A:
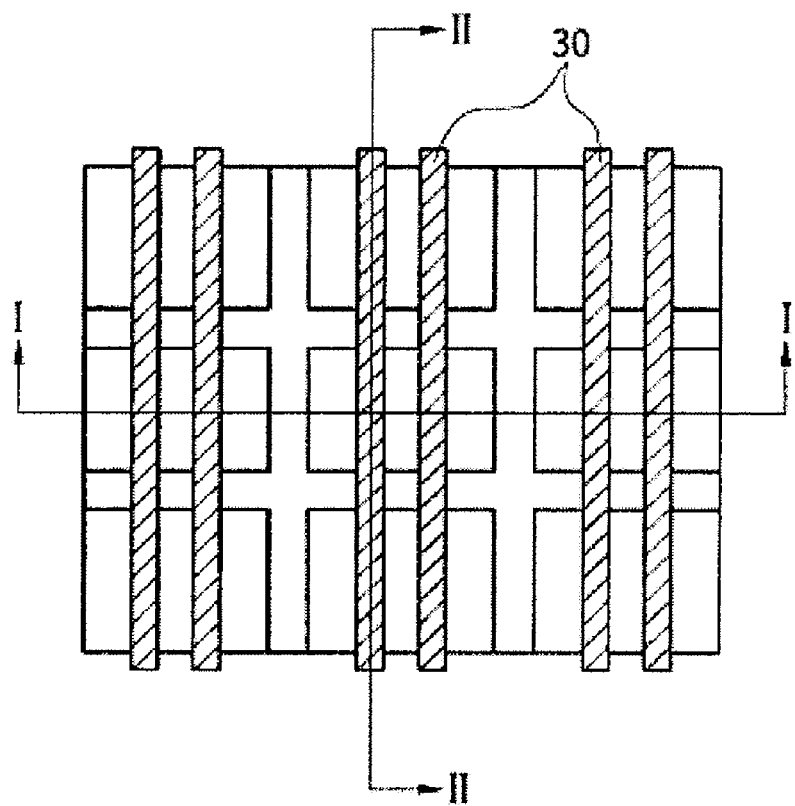
Figure 8B:
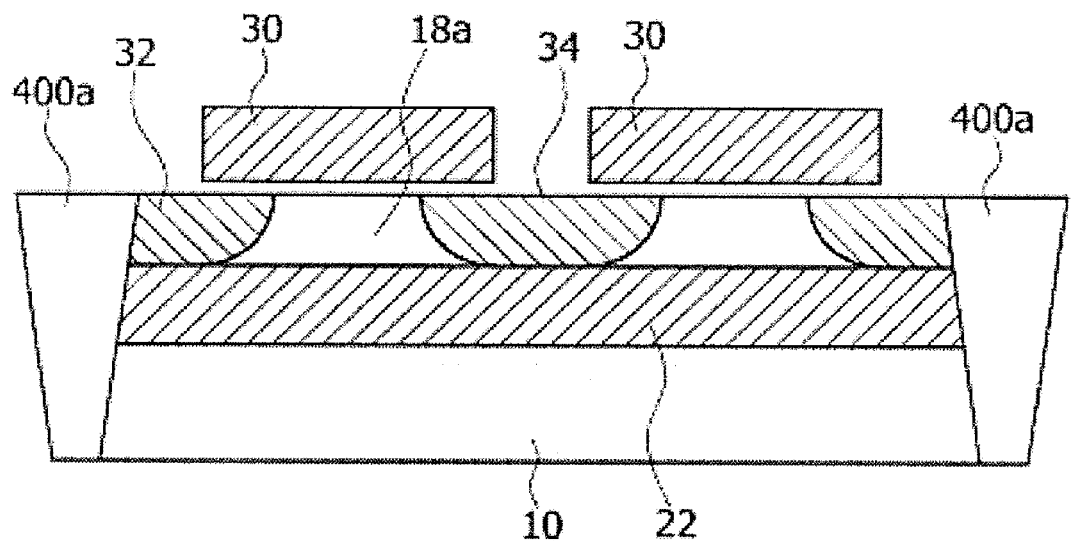
Figure 8C:
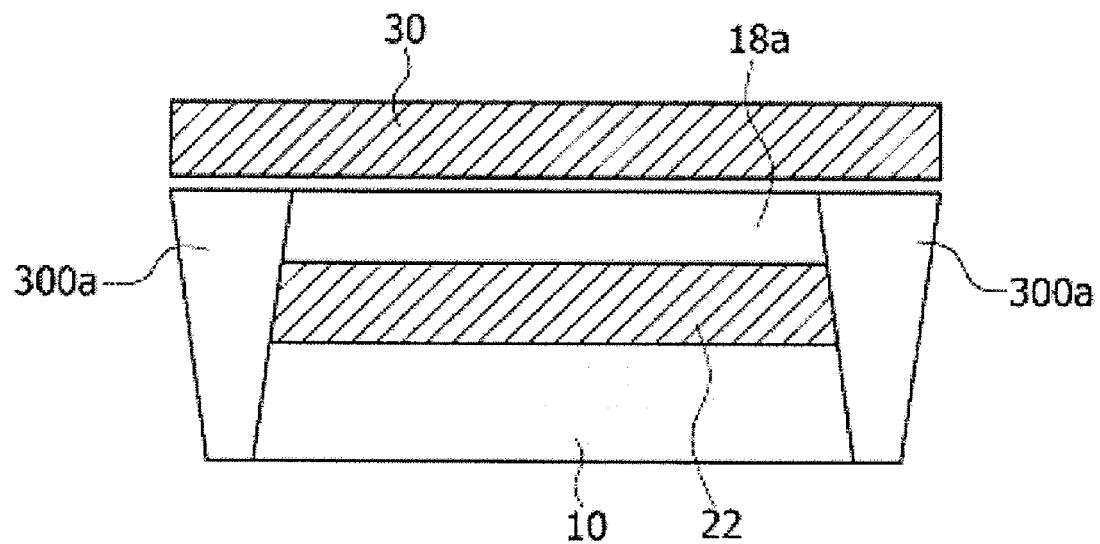

Referring to FIGS. 8A to 8C, a gate 30 is formed by applying a gate oxide film onto the semiconductor epitaxial layer 18 isolated by the device isolation films 300a and 400a formed in the respective first and second trenches 300 and 400 and the buried insulation film 22. Further, source and drain regions 32 and 34 are formed in the semiconductor epitaxial layer 18 under both sides of the gate 30. Here, the source and drain regions 32 and 34 are formed on the buried insulation film 22 by introducing impurities into the semiconductor epitaxial layer 18. Further, source and drain regions 32 and 34 are spaced from each other, and thus a portion 18a of the semiconductor epitaxial layer 18 between the source region 32 and the drain region 34 functions as a floating channel body. In particular, a partially depleted floating channel body or a fully depleted floating channel body can be realized by adjusting the thickness of the semiconductor epitaxial layer.

The floating body cell formed through the above processes is advantageous in that a buried insulation film can be formed through a thermal oxidation process, so that the interfacial defects between silicon and the buried insulation film are less than those between silicon and a buried insulation film formed using a conventional SOI wafer, with the result that data retention time, which is one of the technical difficulties of 1 T DRAM, can be effectively improved. Further, the floating body cell formed through the above-described processes is advantageous in that, in the formation of the floating body cell, a bulk silicon wafer may be used instead of a conventional, expensive SOI wafer, so that the production cost of the semiconductor device can be reduced, and the data retention problems of the cell array can also be improved compared to a conventional floating body cell formed with a N-type well and a P-type well.

As described above, according to the invention, when a buried insulation film is formed in a bulk silicon wafer instead of a conventional SOI wafer, effects the same as those of the conventional SOI wafer can be obtained. In particular, a buried insulation film can be formed through a thermal oxidation process, so that the interfacial defects between silicon and the buried insulation film are less than those between silicon and a buried insulation film formed using a conventional SOI wafer, with the result that data retention time, which is one of the technical difficulties of 1 T DRAM, can be effectively improved. Further, when a bulk silicon wafer is used instead of a conventional, expensive SOI wafer, the production cost of the semiconductor device can be reduced, and the data retention problems of cell array can also be improved compared to a conventional floating body cell formed with a N-type well and a P-type well.

Further, according to the invention, a buried insulation film can be formed through a thermal oxidation process or through a deposition process. Further, peripheral circuits adjacent to a memory region must also be formed on the SOI wafer when a conventional SOI wafer is used, but, in the invention, since a buried insulation film can be selectively formed only in the memory region, external circuits used in DRAM can be directly used as the peripheral circuits. Although the preferred embodiments of the invention have been disclosed for illustrative purposes, various modifications, additions, and substitutions are possible, without departing from the scope and spirit of the invention as disclosed in the accompanying claims.

What is claimed is:

1. A method of manufacturing a semiconductor device, comprising:
   (a) forming a buffer layer on a semiconductor substrate;
   (b) patterning the buffer layer in a first direction to form buffer layer patterns having lateral surfaces and being spaced from each other at predetermined intervals;
   (c) forming a semiconductor epitaxial layer on and between the buffer layer patterns;
   (d) forming a first trench in the semiconductor epitaxial layer in a second direction, intersecting the first direction, to expose lateral surfaces of the buffer layer patterns;
   (e) selectively removing the buffer layer patterns exposed by the first trench to form spaces;
   (f) forming buried insulation films in the spaces formed by removal of the buffer layer patterns, a portion of semiconductor epitaxial layer being disposed between the buried insulation films;
   (g) removing a portion of the semiconductor epitaxial layer disposed between the buried insulation films to form a second trench in the first direction; and
   (h) forming device isolation films in the first and second trenches.

2. The method according to claim 1, wherein the buffer layer comprises a material that can be selectively etched with respect to the semiconductor substrate and the semiconductor epitaxial layer.

3. The method according to claim 1, wherein the semiconductor substrate is a silicon substrate, the semiconductor epitaxial layer is a silicon epitaxial layer, and the buffer layer is an SiGe layer.

4. The method according to claim 1, wherein the buffer layer comprises a selective etching layer that can be removed through selective etching in (e) and a seed layer serving as a seed of the semiconductor epitaxial layer in (c).

5. The method according to claim 1, wherein, in (d), a depth of the first trench is greater than a depth of the buffer layer pattern.

6. The method according to claim 1, comprising, in (e), removing the buffer layer patterns through a selective wet etching process.

7. The method according to claim 1, comprising, in (g), forming the second trench by removing the semiconductor epitaxial layer formed between the buffer layer patterns in (c).

8. The method according to claim 1, comprising horizontally isolating the semiconductor epitaxial layer by the device isolation films formed in the first and second trenches, and vertically isolating the semiconductor epitaxial layer from the semiconductor substrate by the buried insulation film.

9. The method according to claim 1, wherein, in (d), the second direction is perpendicular to the first direction.

10. A semiconductor device manufactured by a method comprising:
    (a) forming a buffer layer on a semiconductor substrate;
    (b) patterning the buffer layer in a first direction to form buffer layer patterns having lateral surfaces and being spaced from each other at predetermined intervals;
    (c) forming a semiconductor epitaxial layer on and between the buffer layer patterns;
    (d) forming a first trench in the semiconductor epitaxial layer in a second direction, intersecting the first direction, to expose lateral surfaces of the buffer layer patterns;
    (e) selectively removing the buffer layer patterns exposed by the first trench to form spaces;
    (f) forming buried insulation films in the spaces formed by removal of the buffer layer patterns, a portion of the semiconductor epitaxial layer being disposed between the buried insulation films;
    (g) removing a portion of the semiconductor epitaxial layer disposed between the buried insulation films to form a second trench in the first direction; and
    (h) forming device isolation films in the first and second trenches,
    wherein the semiconductor epitaxial layer formed on a semiconductor substrate is horizontally isolated by device isolation films and vertically isolated from the semiconductor substrate by a buried insulation film.

11. The semiconductor device according to claim 10, wherein a depth of the device isolation film is greater than a depth of the buried insulation film.

12. The semiconductor device according to claim 10, further comprising:
    a gate formed on the semiconductor epitaxial layer isolated by the device isolation film and the buried insulation film;
    a source region formed in the semiconductor epitaxial layer; and a drain region formed in the semiconductor epitaxial layer and spaced from the source region.

13. The semiconductor device according to claim 12, wherein the source region and the drain region are formed on the buried insulation film, and a portion of the semiconductor epitaxial layer between the source region and the drain region thus functions as a floating channel body.

14. The semiconductor device according to claim 10, wherein the buffer layer comprises a material that can be selectively etched with respect to the semiconductor substrate and the semiconductor epitaxial layer.

15. The semiconductor device according to claim 10, wherein the semiconductor substrate is a silicon substrate, the semiconductor epitaxial layer is a silicon epitaxial layer, and the buffer layer is an SiGe layer.

16. The semiconductor device according to claim 10, wherein the buffer layer comprises a selective etching layer that can be removed through selective etching in (e) and a seed layer serving as a seed of the semiconductor epitaxial layer in (c).

17. The semiconductor device according to claim 10, wherein, in (d), a depth of the first trench is greater than a depth of the buffer layer pattern.

18. The semiconductor device according to claim 10, comprising, in (e), removing the buffer layer patterns through a selective wet etching process.

19. The semiconductor device according to claim 10, comprising, in (g), forming the second trench by removing the semiconductor epitaxial layer formed between the buffer layer patterns in (c).

20. The semiconductor device according to claim 10, wherein, in (d), the second direction is perpendicular to the first direction.

* * * * *